United States Patent [19]

Kagami et al.

[11] Patent Number: 4,859,993
[45] Date of Patent: Aug. 22, 1989

[54] WAFER ACCOUNTING AND PROCESSING SYSTEM

[75] Inventors: Toshihiko Kagami, Kofu; Kazuyoshi Kobayashi, Yamanashi; Eiji Asakawa, Yamanashi; Atushi Osada, Yamanashi; Kozo Hara, Yamanashi; Yasuji Abe, Yamanashi, all of Japan

[73] Assignee: Tokyo Electron Limited, Tokyo, Japan

[21] Appl. No.: 155,518

[22] Filed: Feb. 12, 1988

[30] Foreign Application Priority Data

Feb. 13, 1987 [JP] Japan .................................. 62-31048

[51] Int. Cl.$^4$ .................. G08C 21/00; G01B 11/14
[52] U.S. Cl. ............................ 340/674; 377/8; 377/53; 340/568; 269/903
[58] Field of Search ............ 377/8, 53; 340/674; 340/568; 269/43, 903

[56] References Cited

U.S. PATENT DOCUMENTS 3,665,444 5/1972 Scott ................................ 340/574
4,513,430 4/1985 Vora et al. ......................... 377/8

FOREIGN PATENT DOCUMENTS 60-101746 7/1985 Japan .
61-55341 4/1986 Japan .
61-127639 8/1986 Japan .
61-129340 8/1986 Japan .
61-153345 9/1986 Japan .
62-14733 1/1987 Japan .

Primary Examiner—John S. Heyman
Attorney, Agent, or Firm—Oblon, Spivak, McClelland, Maier & Neustadt

[57] ABSTRACT

According to the invention, each detecting element pair of a wafer detector is constituted by light-emitting and light-receiving elements of transmission-type and is arranged at a position corresponding to a fitting edge portion of one of a plurality of wafers. The number of detecting element pairs is equal to the number of wafers which can be stored in the wafer counter. Light emitted from a light-emitting element to a light-receiving element is kept substantially perpendicular to a surface of a wafer and is shielded when a wafer is engaged in a wafer counter. A change in the amount of light received by the light-receiving element is detected by a signal processor electrically connected to each of the detecting element pairs. The positions and number of a large number of wafers can be accurately and instantaneously detected with an extremely simple structure.

13 Claims, 7 Drawing Sheets

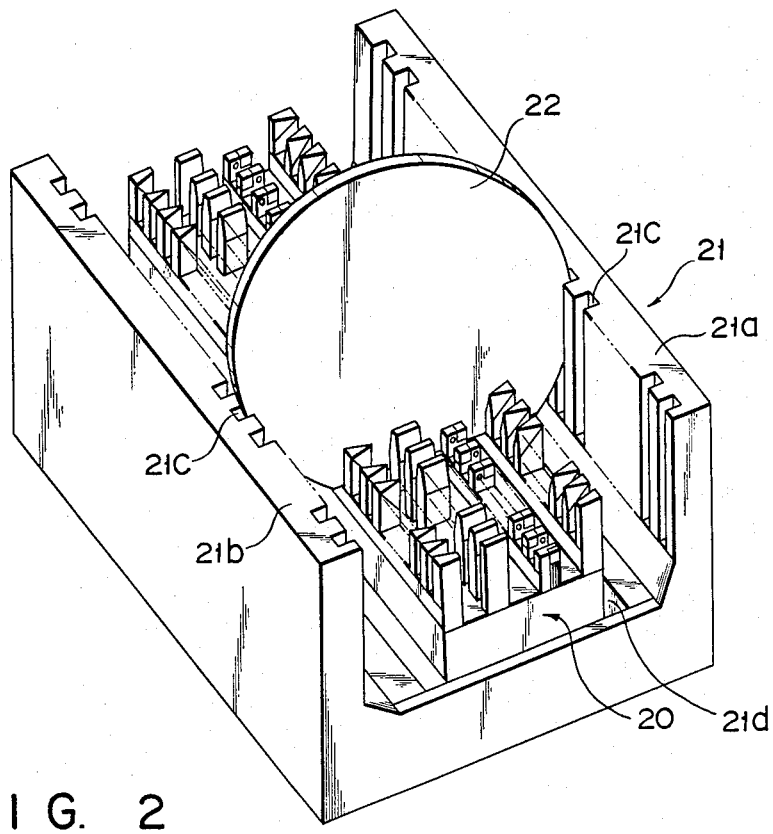
F I G. 2

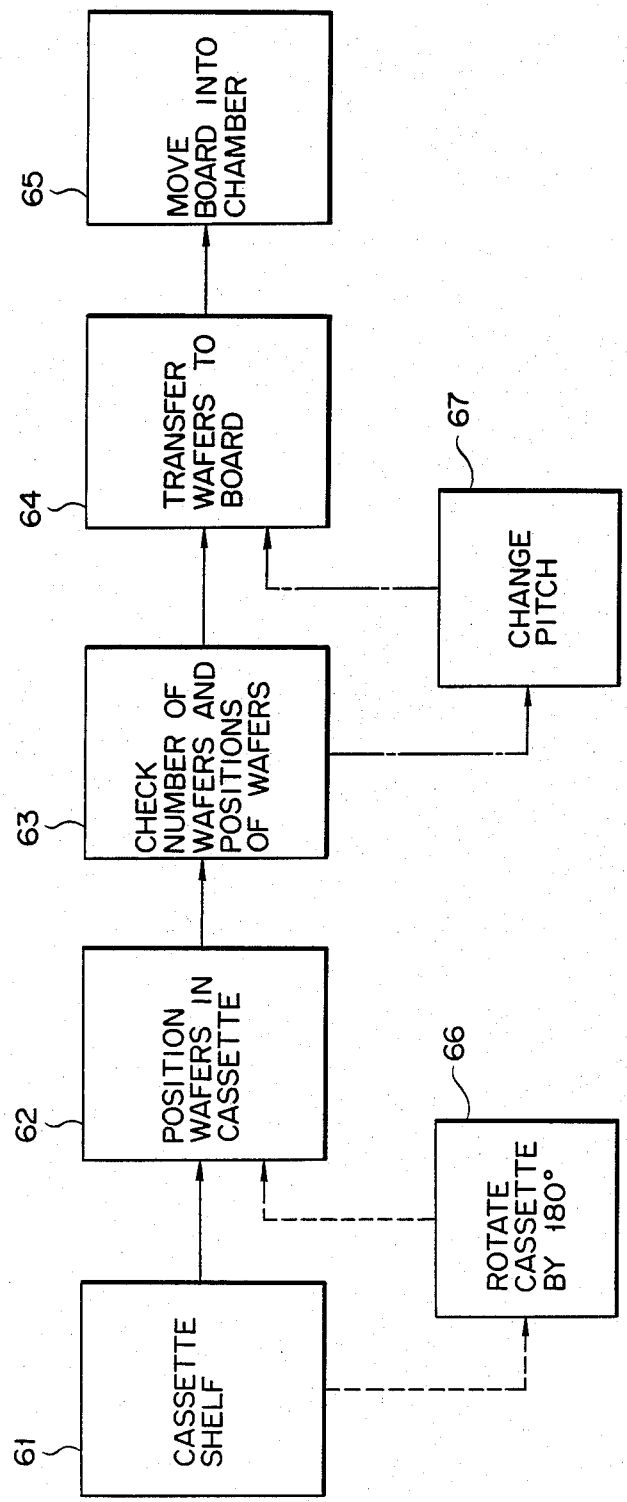
F I G. 7

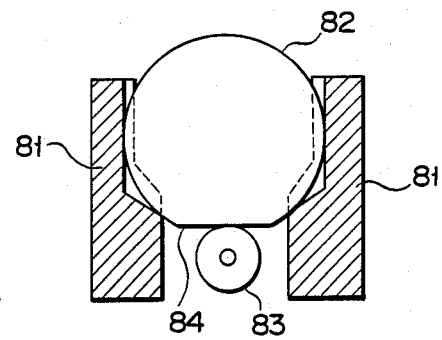
F I G. 9A
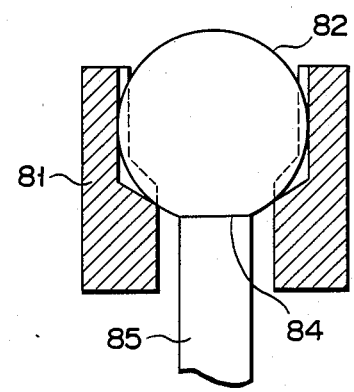
F I G. 9B
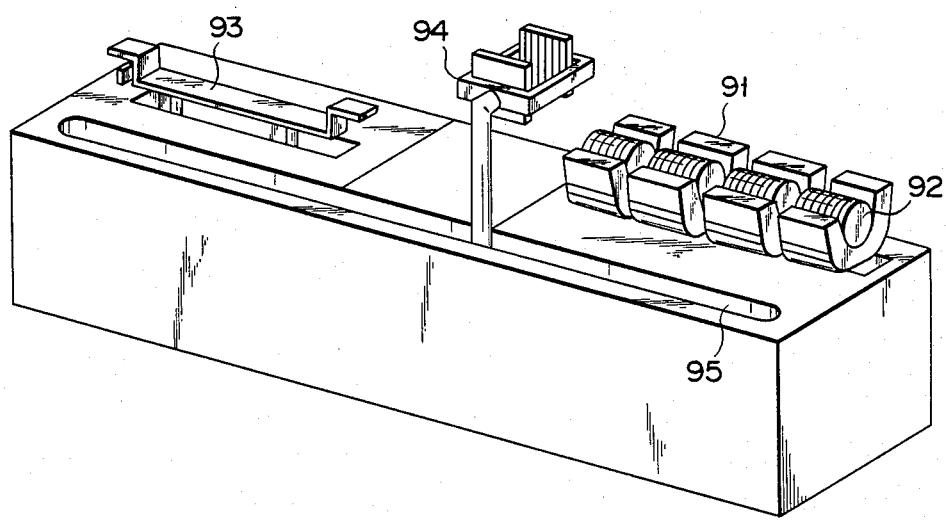
F I G. 10

WAFER ACCOUNTING AND PROCESSING SYSTEM

BACKGROUND OF THE INVENTION

1. Field of the Invention

The present invention relates to a semiconductor wafer accounting and processing system which can detect both the number of wafers stored in a wafer cassette and their positions therein.

2. Description of the related art including information disclosed under §§ 1.97–1.99.

During the manufacturing of semiconductor integrated circuits, a wafer detector is used to monitor the presence/absence of wafers in units of lots and to check the number of wafers for supplying to the next process. This the wafer detector does by detecting the number of wafers stored in the wafer cassette and their storage positions.

Such a wafer processing system disclosed in, for example, Japanese Utility Model Disclosure No. 61-129340. FIG. 1 of this disclosure shows a method of detecting the number and positions of wafers, using this wafer detector. Referring to FIG. 1, reference numeral 1 denotes wafers stored in a wafer cassette (not shown). Light-emitting element 3 and light-receiving element 4 are arranged surrounding the wafer cassette and opposing each other such that optical axis 2 is inclined at predetermined angle 8 with respect to a surface of wafer 1. Light-emitting and light-receiving elements 3 and 4 intermittently move along a direction formed by the arrangement of wafers 1. This moving pitch of these elements 3 and 4 is equal to an arranging pitch D of wafers 1. When infrared rays are emitted from light-emitting element 3 toward light-receiving element 4, the infrared rays along optical axis 2, are shielded by wafer 1 and the amount of infrared rays received by light-receiving element 4 is attenuated. As a result, the presence of wafer 1 is detected by this attenuation of infrared rays. On the other hand, when the amount of infrared rays is not attenuated, the absence of wafer 1 is confirmed. The presence/absence of wafer 1 is detected in each intermittent movement of light-emitting and light-receiving elements 3 and 4, thereby detecting the number of wafers 1.

According to another wafer detector, a reflecting-type sensor is used. Infrared rays are radiated from above a wafer cassette onto a wafer and the reflected rays are received by the sensor so as to detect the presence/absence of the wafer. Similarly, in this case, the number of wafers is detected by emitting infrared rays and receiving reflected light while intermittently scanning the light-emitting element and the light-receiving element along an arranging direction of the wafers.

However, in such conventional wafer detector, emitted infrared rays may be irregularly reflected from a surface or end portion of a wafer since the light is not always radiated perpendicular to the surface or the end portion and sometimes dust and fault exist there. In this case, the light-receiving element erroneously detects the wafer. As a result, the positions and number of wafers cannot be accurately detected.

SUMMARY OF THE INVENTION

It is an object of the present invention to provide a low-cost wafer accounting and processing systems which has a simple structure and which can accurately and simultaneously detect the number and positions of a plurality of semiconductor wafers.

According to the present invention, there is provided a wafer accounting and processing sytems comprising a wafer cassette for storing a plurality of semiconductor wafers at predetermined intervals, detecting element pairs, each consisting of light-emitting and light-receiving elements, which are arranged on a base, being spaced apart from each other by an interval sufficient to allow the wafer to be inserted in and removed from a place formed between the detecting element pairs, the number of the detecting element pairs being equal to the number of wafers which can be stored in the wafer cassette, and a signal processor electrically connected to each of the detecting element pairs.

In this case, each of the detecting element pairs is constituted by transmission-type elements, the light from a light-emitting element is emitted perpendicular to a surface of a wafer. This is because irregular reflection of light on a wafer surface caused by the reflecting-type elements can be prevented and detection precision can be increased.

The detecting element pair preferably consists of light-emitting and light-receiving elements constituted by, e.g., a photocoupler. It is especially preferable to constitute the light-receiving element by using, e.g., a thin solar cell type element and reducing its occupying space, thereby increasing a wafer storage capacity of the wafer cassette.

The detecting element pair is preferably mounted on an insulator constituted by, e.g., glass epoxy resin or the like so as to minimize influences of electrical noise on the detecting element pair and to increase detection precision.

The detecting element pair is preferably arranged on the wafer cassette such that an optical axis between the light-emitting and light-receiving elements is positioned closer to the center than to an orientation flat side of a wafer. This increases freedom in selecting a storing direction of wafers in the wafer cassette.

In addition, the detecting element pair is preferably arranged on the wafer cassette such that the optical axis between the light-emitting and light-receiving elements is substantially perpendicular to a surface of a wafer stored in the wafer cassette. This prevents irregular reflection of light on the surface of the wafer.

The detecting element pair may be detachably arranged in respective wafer storage regions of the wafer cassette. This makes it easy to take wafers in and out from each processing step while detecting the positions and number of wafers using the wafer detector elements.

A wafer guide is preferably arranged in each wafer storage region of the wafer cassette to facilitate a storage operation of wafers. These wafer guides and the wafer cassette are preferably made of a fluoroplastic material, e.g., DELRIN (tradename) in order to prevent dust.

BRIEF DESCRIPTION OF THE DRAWINGS

FIG. 2 is a view for explaining a wafer cassette in which a wafer counter according to an embodiment of the present invention is arranged;

FIG. 7 is a view for explaining the wafer transfer operation;

FIGS. 9A and 9B are views for explaining alignment of orientation flats of wafers; and FIG. 10 is a perspective view of a wafer transfer mechanism.

DETAILED DESCRIPTION OF THE PREFERRED EMBODIMENT

Figure 1:
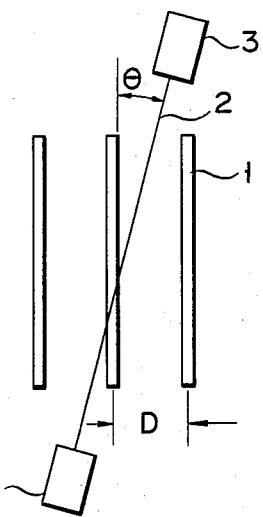
FIG. 1 is a view illustrating a method of detecting the positions and number of wafers using a conventional wafer counter.

An embodiment of the present invention will be described below with reference to the accompanying drawings.

FIGS. 2 is a view for explaining wafer cassette 21 incorporating detector base counter 20 of the present invention. Rectangular through hole 21d is formed in the bottom of cassette 21. A width of this hole 21d is set as not to drop a large number of wafers 22 in their alignment direction. Wafer cassette 21 is a fluoroplastic (DELRIN) container having a U-shaped cross section. A plurality of wafers 22 are supported by both side walls 21a and 21b at predetermined intervals, and a large number of grooves 21c are formed on opposite (inner) surfaces of side walls 21a and 21b. The depth of each groove 21c is determined so as not to adversely affect effective semiconductor chips located in the peripheral portion of the wafer and is given as 1.5 mm. Detector base 20 can be moved vertically by a lifting mechanism 28 (see FIG. 5) from a position below the bottom of wafer cassette 21 through through hole 21d while storage intervals of wafers 22 are kept unchanged.

Figure 3:
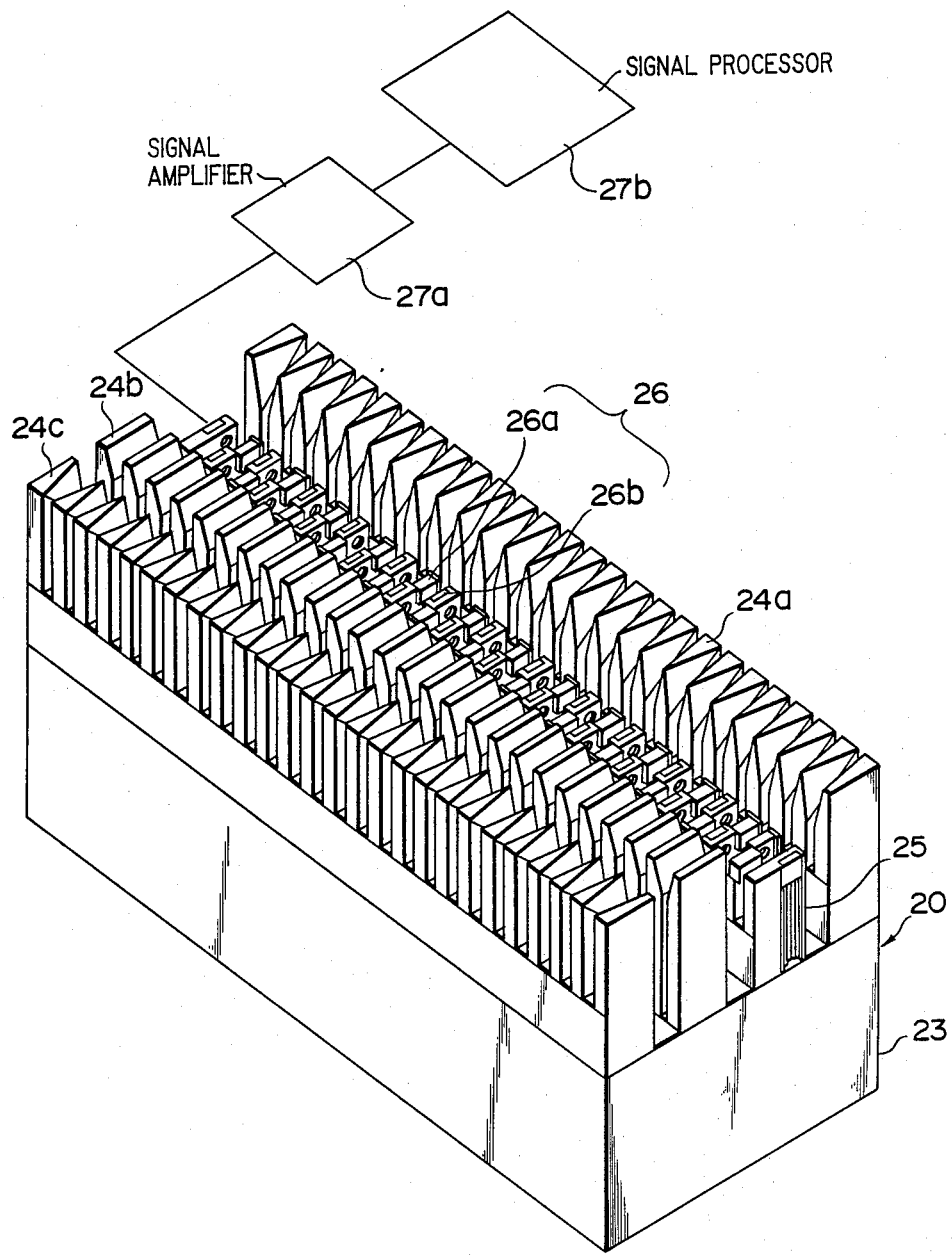
FIG. 3 is an enlarged perspective view of the wafer cassette in FIG. 2.

FIG. 3 is an enlarged perspective view of wafer counter 20 in FIGS. 2. Reference numeral 23 denotes a plastic rectangular parallelopiped base made of a fluoroplastic material (DELRIN) or the like. A plurality of wafer guides 24a, 24b, and 24c extend from both side and central portions of base 23 along the longitudinal direction. Wafer guides 24a, 24b, and 24c are arranged to oppose corresponding storage grooves 21c of wafer cassette 21. More specifically, wafer guides 24a, 24b, and 24c are spaced apart from each other by intervals allowing wafer 22 to be smoothly taken in and out. An insertion depth of the edge of wafer 22 is determined not to adversely affect peripheral semiconductor chips. Wafer guides 24a, 24b, and 24c consist of a material such as a fluoroplastic material to provide a dustproof countermeasure since they are brought into contact with wafer 22. A plurality of insulators 25 extend between wafer guides 24a on one side portion and wafer guides 24b on the central portion. Insulators 25 are disposed so as to correspond to the arrangement of wafer guides 24a, 24b, and 24c, i.e., at intervals allowing wafers 22 to be taken in and out. Accordingly, wafer guides 24a, 24b, and 24c, and insulators 25 extend from base 23. As can be seen in FIG. 3 wafer guides 24c form one column, wafer guides 24b form a second column, insulators 25 form a third column and wafer guides 24a form a fourth column. These columns are complemented by comb-like rows of wafer guides 24c, 24b, 24a and insulators 25 between which the wafers 22 are inserted. Wafer guides 24a, 24b, and 24c guide wafer 22 when detector base 20 is moved upward to unload wafer 22 from cassette or detector base 20 is moved downward to load wafer 22 into cassette 21. Wafer guides 24a, 24b, and 24c, and insulators 25 are arranged at intervals of, e.g., 4.7625 mm. Wafer guides 24a and 24c on the both sides are formed into rectangular columns, and have preferably knife-edged distal end portions. Each of wafer guides 24b on the central portion has a trapezoidal distal end portion. These shapes of the wafer guides allow wafers 22 to be easily taken in and out. Detecting element pair 26 is mounted on each insulator 25. Detecting element pair 26 is electrically connected to signal processor 27b through signal amplifier 27a to detect the beam shielded by semiconductor wafer 22.

Figure 4:
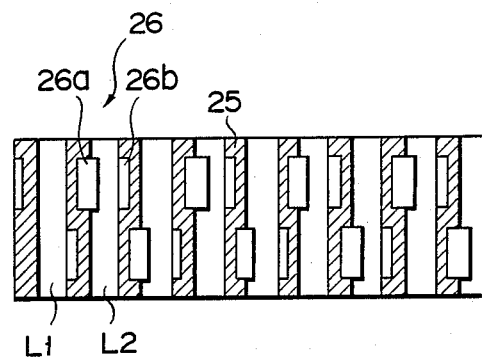
FIG. 4 is a view illustrating a mounting state of detecting element pairs.

As shown in FIG. 4, each detecting element pair 26 is constituted by light-emitting and light-receiving elements 26a and 26b, which are composed of transmission-type sensor elements and arranged to oppose each other.

As shown in FIG. 4, detecting element pair 26 is constituted by a photocoupler consisting of light-emitting and light-receiving elements 26a and 26b arranged to oppose each other through space L1. With this arrangement, the presence/absence of wafer 22 inside space L1 can be optically detected by detecting element pair 26. More specifically, when wafer 22 is not present, light-receiving element 26b receives light from light-emitting element 26a. When wafer 22 is present, an output of light-receiving element 26b is set to zero. The presence/absence of wafers 22 in space L2 and other spaces can be similarly detected. If elements of detecting element pairs 26 are arranged in a row, it is difficult to form a space between light-emitting and light-receiving elements 26a and 26b so as to correspond to storage intervals of wafers 22 stored in wafer cassette 21. For this reason, detecting element pairs 26 are arranged on insulators 25 in two rows. The positions of light-emitting and light-receiving elements 26a and 26b in adjacent spaces are shifted from each other to reduce the size of each space, thereby forming spaces corresponding to the size of wafer cassette 21.

A method of detecting the positions and number of wafers 22 using wafer counter 20 having the above-described arrangement will be described below.

Figure 5:
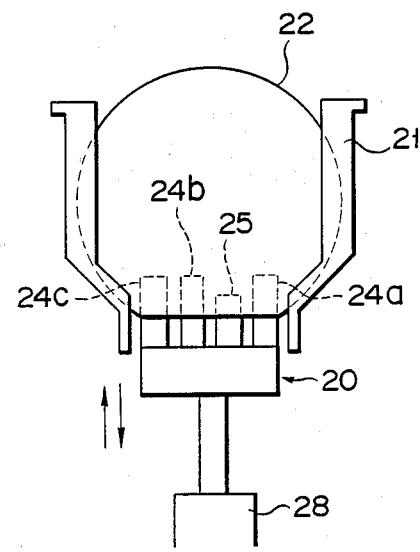
FIG. 5 is a view illustrating a state wherein the wafer counter is moved up and down.

As shown in FIG. 5, wafer counter 20 comprising wafer guides 24a to 24c, and detecting element pairs 26 is moved upward by elevation mechanism 28. Consequently, wafer counter 20 is inserted into wafer cassette 21 storing a plurality of wafers 22. In this case, in order to insert wafer counter 20 into wafer cassette 21, wafer cassette 21 may be moved downward contrary to the above method. In addition, wafer cassette 21 may be set in an upright posture so as to keep wafers 22 horizontal, and then wafer counter 20 may be inserted into wafer cassette 21.

Figure 6:
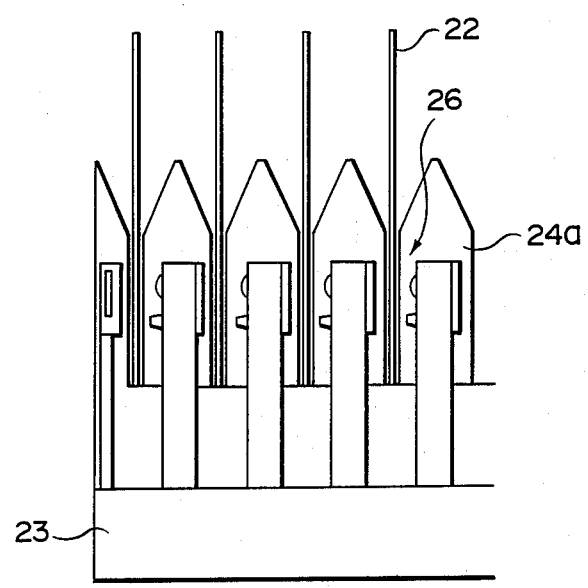
FIG. 6 is a view illustrating a method of detecting the positions and number of wafers using the wafer counter according to the present invention.

Subsequently, as shown in FIG. 6, wafers 22 are guided by wafer guides 24a and 24b and inserted into spaces between adjacent detecting element pairs 26 arranged in the form of a comb. Infrared rays are emitted from light-emitting element 26a to detect the presence/absence of wafers 22. At this time, the positions and number of wafers 22 are finally detected by signal processor 27b and the result is transferred to the next step or displayed on a monitor or the like.

In the above embodiment, the wafer counter is described only in terms of detection of the positions and number of wafers. However, transfer of wafers may be simultaneously performed.

Thus, according to the embodiment, by forming wafer guides 24b between wafer guides 24a and 24c arranged on the both sides, wafers 22 can be accurately guided and stored without causing a positional error.

As has been described above, according to the present invention, since wafers stored in the wafer cassette can be simultaneously detected, the positions and number of wafers can be detected in a short period of time.

In addition, since the number of sensors is set to be equal to or more than that of wafers to be stored in the wafer cassette, a special detecting mechanism is not required, and hence detection can be performed at ½ or less of the cost in the conventional apparatus.

The wafer counter can be effectively utilized during each manufacturing process of semiconductor devices. Wafers must be transferred to a heat-resistant board when they are heated in a heating furnace such as a CVD (Chemical Vapor Deposition) furnace or an oxidation furnace.

When the cassette is not completely filled with wafers and wafers are transferred to the heat-resistant board, the corresponding empty positions of wafers are present on the board. In this state, wafers are not consecutively aligned on the board but irregularly placed on it. This irregularity disturbs a reaction gas flow in the reaction in the furnace. Gas turbulence causes nonuniformity in the process and directly degrades the product yield. In order to solve these problems, the wafer counter of the present invention is applied.

Figure 8A:
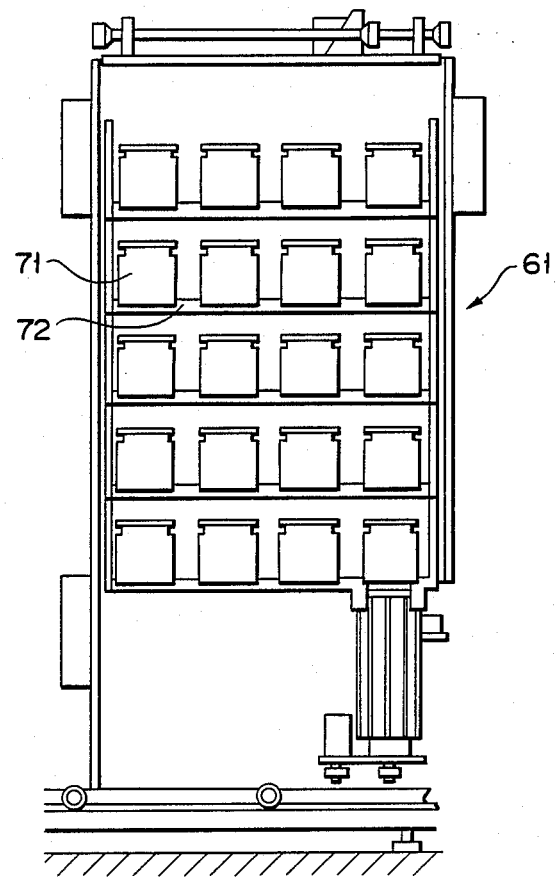
FIGS. 8A and 8B are views for explaining a cassette shelf.
Figure 8B:
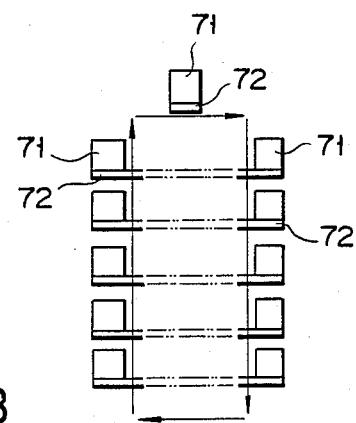

A practical application is shown in FIG. 7. Cassette shelf 61 for storing cassettes each of which stores, e.g, 25 wafers, is arranged to temporarily store the wafers after the previous process is completed. Cassette shelf 61 has five horizontal boards 72 (FIG. 8A). Each board 72 supports four wafer cassettes 71. Each board 72 is rotated by 180° on the rear side while the horizontal state of the cassettes, i.e., each board 72 is kept horizontal. A desired cassette is fed to a transfer position (FIG. 8B). Such a cassette storage mechanism may be a two-dimensional structure. The removed cassette is fed by, e.g., a conveyor belt to a position where orientation flats of the wafers are aligned with each other, i.e., unit 62 for positioning wafers in the cassette.

As shown in FIG. 9A, in unit 62, roller 83 is rotated while 25 wafers aligned in cassette 81 are supported by roller 83 from the lower direction. Wafers 82 stop rotation when orientation flats 84 oppose roller 83, and roller 83 is then stopped. Alignment of orientation flats 84 is not completed by roller 83. As shown in FIG. 9B, flat plate 84 is brought into contact with slightly misaligned orientation flats 84. Therefore, perfect alignment can be performed. If an aligning means comprises two rollers 83 and orientation flats 84 are aligned with a plane defined by vertices of rollers 83, flat plate 85 can be omitted. After the above alignment is completed, the cassette is fed to wafer detector 63. In counter 63 as described above, wafers are respectively fitted in grooves of detector 63, and the number of wafers and empty positions are detected. Thereafter, the wafers are transferred to unit 64 for transferring the wafers to the board. In unit 64, as shown in FIG. 10, array 92 of 25 wafers stored in cassette 91 is transferred to wafer gripper 94 with grooves to be fitted with edges of 25 wafers in accordance with robot manipulation. A wafer support (not shown) is moved upward from a position below cassette 91, so that 25 wafers are fitted in grooves by their own weights.

25 wafers are simultaneously gripped by wafer gripper 94 according to robot manipulation while the wafer array stored in the wafer support and then cassette 91 are kept in the upper position. In this state, the wafers are fed to grooves of a boat, e.g., heat-resistant quartz boat 93 along the feed path. The above operation is repeated for four cassettes 91, so that 75 wafers 92 can be transferred to quartz board 93. The quartz board which supports the wafers is loaded in a heating chamber such as a reaction tube in a diffusion furnace.

In the above operation, the layout of wafers is to be often changed. For example, some wafers are fed to a plasma CVD furnace. In this case, each cassette removed from cassette shelf 61 is rotated through 180° in units of wafers by rotary table 66. Therefore, the wafers from the rotated cassette and the non-rotated cassette are arranged alternately. If the groove pitch of the boat is different from that of the cassette, the wafer layout is checked by the wafer counter, and step 67 for changing the pitches is performed.

What is claimed is:

1. A wafer accounting and processing system, comprising:
   plural wafer guides spaced apart from each other formed within a cassette to engage with edges of wafers each aligned at a predetermined pitch;
   plural detecting element pairs, each detecting element pair consisting of a light-emitting element and a light-receiving element also formed within said cassette in cooperation with said plural wafer guides such that an optical path is shielded when said wafer is engaged with a corresponding wafer guide; and
   a signal processor electrically connected to said detecting element pair, said signal processor being adapted to detect the presence or absence of a wafer.

2. A system according to claim 1, wherein:
   said detecting element pair comprise transmission-type elements.

3. A system according to claim 1, wherein:
   said detecting element pair comprises a photo-coupler consisting of light-emitting and light-receiving elements.

4. A system according to claim 1, wherein:
   wafer guides are arranged on a base to guide the respective wafers to each place formed between said detecting element pair.

5. A system according to claim 4, wherein said wafer guides are formed of a fluoroplastic.

6. A system according to claim 1, wherein said detecting element pair is held on a base by insulators.

7. A system according to claim 6, wherein said insulators are formed of glass epoxy resin.

8. A system according to claim 1, wherein:
   said detecting element pair is arranged such that an optical axis between said light-emitting and light-receiving elements is closer to the center than to an orientation flat side of a wafer.

9. A system according to claim 1, wherein:
   said detecting element pair is arranged on a base such that the wafer is inserted in and removed from a place formed between said detecting element pair and another detector element pair.

10. A system according to claim 1, wherein: two detecting element pair are arranged such that an optical axis between a light-emitting element and a light-receiving element is substantially perpendicular to a surface of a wafer located between said two detecting element pairs.

11. A wafer accounting and processing system, comprising:
- a base;
- a plurality of wafer guiding means arranged in a plurality of columns and rows for properly positioning a plurality of wafers in said wafer accounting and processing system, said plurality of wafer guiding means being mounted to said base;
- a plurality of insulators mounted in a single column and in a plurality of rows on said base such that each wafer of said plurality of wafers can be inserted between adjacent rows of said plurality of wafer guiding means and said plurality of insulators;
- each insulator of said plurality of insulators having a detecting element pair such that a light-emitting element of one insulator is focused upon a light-receiving element of another insulator in an adjacent row; and
- signal processing means electrically connected to the detecting element pair of each insulator of said plurality of insulators.

12. A wafer accounting and processing system according to claim 11, further comprising:
- a wafer cassette having a first side wall and a second side wall between which said base is mounted; and
- a plurality of complementary grooves arranged on said first side wall and said second side wall.

13. A wafer accounting and processing system according to claim 11, wherein:
- when a wafer is located between the light-emitting element of one insulator and the light receiving element of another insulator, an output of the light-receiving element is zero.

* * * * *